(12) United States Patent
Schinagl

(10) Patent No.: US 10,774,999 B2
(45) Date of Patent: Sep. 15, 2020

(54) ILLUMINATION DEVICE WITH MULTI-COLOR LIGHT-EMITTING ELEMENTS

(71) Applicant: Quarkstar LLC, Las Vegas, NV (US)

(72) Inventor: Ferdinand Schinagl, North Vancouver (CA)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 16/291,682

(22) Filed: Mar. 4, 2019

(65) Prior Publication Data

US 2019/0360644 A1 Nov. 28, 2019

Related U.S. Application Data

(63) Continuation of application No. 15/625,953, filed on Jun. 16, 2017, now Pat. No. 10,222,008, which is a
(Continued)

(51) Int. Cl.
*F21K 9/64* (2016.01)
*F21K 9/61* (2016.01)
(Continued)

(52) U.S. Cl.
CPC .................. *F21K 9/64* (2016.08); *F21K 9/61* (2016.08); *F21K 9/62* (2016.08); *G02B 6/0023* (2013.01);
(Continued)

(58) Field of Classification Search
CPC ..... F21K 9/61; F21K 9/62; F21K 9/64; G02B 6/0023; H05B 33/0827; H05B 33/0857;
(Continued)

(56) References Cited

U.S. PATENT DOCUMENTS 3,960,579 A 6/1976 Broerner
4,038,448 A 7/1977 Boyd et al.
(Continued)

FOREIGN PATENT DOCUMENTS

EP 2293354 3/2011
WO WO01/07828 2/2001
(Continued)

OTHER PUBLICATIONS

Notification of Transmittal of the International Search Report and the Written Opinion of the International Searching Auhority, International Application No. PCT/US2014/021778, dated Jun. 23, 2014, 11 pages.
(Continued)

*Primary Examiner* — Thomas M Sember
(74) *Attorney, Agent, or Firm* — Fish & Richardson P.C.

(57) ABSTRACT

A variety of illumination devices for general illumination utilizing solid state light sources (e.g., light-emitting diodes) are disclosed. In general, an illumination device can include multiple light sources that are disposed on a substrate, where at least some of the light sources include a light-emitting diode (LED) and a corresponding inelastic scattering element surrounding, at least in part, the LED. The inelastic scattering elements can have different light emission spectra. The illumination device can further include a light-mixing element adapted to receive light that is output by the light sources, where, during operation of the illumination device, each inelastic scattering element inelastically scatters light emitted from its corresponding LED, and the light-mixing element mixes the light received from the inelastic scattering elements to provide the output light.

22 Claims, 7 Drawing Sheets

Related U.S. Application Data continuation of application No. 14/773,301, filed as application No. PCT/US2014/021778 on Mar. 7, 2014, now Pat. No. 9,683,710.

(60) Provisional application No. 61/774,399, filed on Mar. 7, 2013.

(51) Int. Cl.

| | | |
|---|---|---|
| *F21K 9/62* | (2016.01) | |
| *F21V 8/00* | (2006.01) | |
| *H05B 33/08* | (2020.01) | |
| *H01L 25/075* | (2006.01) | |
| *F21Y 115/10* | (2016.01) | |
| *H01L 33/50* | (2010.01) | |
| *F21Y 115/30* | (2016.01) | |
| *F21Y 113/13* | (2016.01) | |
| *H05B 45/20* | (2020.01) | |
| *H05B 45/22* | (2020.01) | |
| *H05B 45/24* | (2020.01) | |
| *H05B 45/46* | (2020.01) | |

(52) U.S. Cl.
CPC ......... *H01L 25/0753* (2013.01); *H05B 45/20* (2020.01); *H05B 45/22* (2020.01); *H05B 45/24* (2020.01); *H05B 45/46* (2020.01); *F21Y 2113/13* (2016.08); *F21Y 2115/10* (2016.08); *F21Y 2115/30* (2016.08); *H01L 33/502* (2013.01); *H01L 33/504* (2013.01); *H01L 2924/0002* (2013.01); *H01L 2933/0091* (2013.01)

(58) Field of Classification Search
CPC ............ H05B 33/0866; H05B 33/0869; H01L 25/0753
See application file for complete search history.

(56) References Cited

U.S. PATENT DOCUMENTS

| | | | |
|---|---|---|---|
| 4,240,692 A | 12/1980 | Winston | |
| 4,301,461 A | 11/1981 | Asano | |
| 4,374,749 A | 2/1983 | Cusano et al. | |
| 4,389,118 A | 6/1983 | Yuasa et al. | |
| 4,797,609 A | 1/1989 | Yang | |
| 4,907,044 A | 3/1990 | Schellhorn et al. | |
| 5,001,609 A | 3/1991 | Gardner et al. | |
| 5,055,892 A | 10/1991 | Gardner et al. | |
| 5,268,635 A | 12/1993 | Bortolini et al. | |
| 5,282,088 A | 1/1994 | Davidson | |
| 5,335,152 A | 8/1994 | Winston | |
| 5,424,855 A | 6/1995 | Nakamura et al. | |
| 5,727,108 A | 3/1998 | Hed | |
| 5,856,727 A | 1/1999 | Schroeder et al. | |
| 6,095,655 A | 8/2000 | Bigliati et al. | |
| 6,111,367 A | 8/2000 | Asano et al. | |
| 6,155,699 A | 12/2000 | Miller et al. | |
| 6,236,331 B1 | 5/2001 | Dussureault | |
| 6,479,942 B2 | 11/2002 | Kimura | |
| 6,495,964 B1 | 12/2002 | Muthu et al. | |
| 6,527,411 B1 | 3/2003 | Sayers | |
| 6,617,560 B2 | 9/2003 | Forke | |
| 6,642,618 B2 | 11/2003 | Yagi et al. | |
| 6,819,505 B1 | 11/2004 | Cassarly et al. | |
| 7,015,514 B2 | 3/2006 | Baur et al. | |
| 7,091,653 B2 | 8/2006 | Ouderkirk et al. | |
| 7,151,283 B2 | 12/2006 | Reeh et al. | |
| 7,286,296 B2 | 10/2007 | Chaves et al. | |
| 7,306,960 B2 | 12/2007 | Bogner et al. | |
| 7,329,907 B2 | 2/2008 | Pang | |
| 7,329,998 B2 | 2/2008 | Jungwirth | |
| 7,344,902 B2 | 3/2008 | Basin et al. | |
| 7,355,284 B2 | 4/2008 | Negley | |
| 7,514,867 B2 | 4/2009 | Yano et al. | |
| 7,522,802 B2 | 4/2009 | Shiau et al. | |
| 7,828,453 B2 | 11/2010 | Tran et al. | |
| 7,859,190 B2 | 12/2010 | Shi | |
| 7,889,421 B2 | 2/2011 | Narendran et al. | |
| 8,007,118 B2 | 8/2011 | O'Neill et al. | |
| 8,083,364 B2 | 12/2011 | Allen | |
| 8,168,998 B2 | 5/2012 | David et al. | |
| 8,314,537 B2 | 11/2012 | Gielen et al. | |
| 8,362,695 B2 | 1/2013 | Aanegola et al. | |
| 8,436,380 B2 | 5/2013 | Aanegola et al. | |
| 8,598,778 B2 | 12/2013 | Allen et al. | |
| 8,791,631 B2 | 7/2014 | Allen et al. | |
| 2003/0117087 A1 | 6/2003 | Barth et al. | |
| 2003/0235050 A1 | 12/2003 | West et al. | |
| 2004/0052076 A1 | 3/2004 | Mueller et al. | |
| 2004/0150991 A1 | 8/2004 | Ouderkirk et al. | |
| 2005/0023545 A1 | 2/2005 | Camras et al. | |
| 2005/0075234 A1 | 4/2005 | Wolff et al. | |
| 2005/0127833 A1 | 6/2005 | Tieszen | |
| 2005/0185416 A1 | 8/2005 | Lee et al. | |
| 2005/0243570 A1 | 11/2005 | Chaves et al. | |
| 2005/0269582 A1 | 12/2005 | Mueller et al. | |
| 2006/0152140 A1 | 7/2006 | Brandes | |
| 2006/0152931 A1 | 7/2006 | Holman | |
| 2006/0255353 A1 | 11/2006 | Taskar et al. | |
| 2007/0018102 A1 | 1/2007 | Braune et al. | |
| 2007/0256453 A1 | 11/2007 | Barnes et al. | |
| 2007/0257267 A1 | 11/2007 | Leatherdale et al. | |
| 2007/0273282 A1 | 11/2007 | Radkov et al. | |
| 2008/0054280 A1 | 3/2008 | Reginelli et al. | |
| 2008/0079910 A1 | 4/2008 | Rutherford et al. | |
| 2008/0080166 A1 | 4/2008 | Duong et al. | |
| 2008/0101754 A1 | 5/2008 | Parker et al. | |
| 2008/0112183 A1 | 5/2008 | Negley | |
| 2008/0297027 A1 | 12/2008 | Miller et al. | |
| 2009/0200939 A1 | 8/2009 | Lenk et al. | |
| 2009/0201677 A1 | 8/2009 | Hoelen et al. | |
| 2009/0272996 A1 | 11/2009 | Chakraborty | |
| 2009/0310352 A1 | 12/2009 | Chang | |
| 2010/0066236 A1 | 3/2010 | Xu et al. | |
| 2010/0073927 A1 | 3/2010 | Lewin et al. | |
| 2010/0097821 A1 | 4/2010 | Huang et al. | |
| 2010/0123386 A1 | 5/2010 | Chen | |
| 2010/0134016 A1 | 6/2010 | York et al. | |
| 2010/0148151 A1 | 6/2010 | Camras et al. | |
| 2010/0172120 A1 | 7/2010 | Wegh et al. | |
| 2010/0232134 A1 | 9/2010 | Tran | |
| 2010/0263723 A1 | 10/2010 | Allen et al. | |
| 2010/0264432 A1 | 10/2010 | Liu et al. | |
| 2010/0290226 A1 | 11/2010 | Harbers et al. | |
| 2010/0301367 A1 | 12/2010 | Nakamura et al. | |
| 2010/0308354 A1 | 12/2010 | David | |
| 2011/0080108 A1 | 4/2011 | Chiang et al. | |
| 2011/0089817 A1 | 4/2011 | Lyons et al. | |
| 2011/0176091 A1 | 7/2011 | Boonekamp et al. | |
| 2011/0182065 A1 | 7/2011 | Negley et al. | |
| 2011/0227037 A1 | 9/2011 | Su | |
| 2011/0267800 A1 | 11/2011 | Tong et al. | |
| 2011/0267801 A1 | 11/2011 | Tong et al. | |
| 2011/0273882 A1 | 11/2011 | Pickard | |
| 2011/0291130 A1 | 12/2011 | Diana et al. | |
| 2011/0298371 A1 | 12/2011 | Brandes et al. | |
| 2012/0033403 A1 | 2/2012 | Lamvik | |
| 2012/0039073 A1 | 2/2012 | Tong | |
| 2012/0068205 A1 | 3/2012 | Galvez et al. | |
| 2012/0112661 A1 | 5/2012 | Van de Ven et al. | |
| 2012/0119221 A1 | 5/2012 | Negley | |
| 2012/0127694 A1 | 5/2012 | Richardson | |
| 2012/0140436 A1 | 6/2012 | Yang et al. | |
| 2012/0147296 A1 | 6/2012 | Montgomery | |
| 2012/0181565 A1 | 7/2012 | David et al. | |
| 2012/0187441 A1 | 7/2012 | Li | |
| 2012/0327656 A1 | 12/2012 | Ramer et al. | |
| 2013/0021776 A1 | 1/2013 | Veerasamy et al. | |
| 2013/0039090 A1 | 2/2013 | Dau | |

(56) References Cited

U.S. PATENT DOCUMENTS

| | | |
|---|---|---|
| 2013/0201715 A1 | 8/2013 | Dau et al. |
| 2014/0333198 A1 | 11/2014 | Allen et al. |
| 2015/0003059 A1 | 1/2015 | Haitz et al. |

FOREIGN PATENT DOCUMENTS

| | | |
|---|---|---|
| WO | WO 01/27962 | 4/2001 |
| WO | WO03/017729 | 2/2003 |
| WO | WO04/076916 | 9/2004 |
| WO | WO2007081812 | 7/2007 |
| WO | PCT/IB2011/052874 | 6/2011 |
| WO | WO 2013/078463 | 5/2013 |

OTHER PUBLICATIONS

Allen, et al. "A nearly ideal phosphor-converted white light-emitting diode", Applied Physics Letters, vol. 92 (2008) 3 pages.

Allen, et al. "ELiXIR—Solid-State Luminaire With Enhanced Light Extraction by Internal Reflection", Journal of Display Technology, vol. 3, No. 2, Jun. 2007 pp. 155-159.

Allen, et al., "Highly Efficient light-emitting composite material for solid-state illumination devices, lasers, and luminescent collectors", U.S. Appl. No. 60/961,185, filed Jul. 19, 2007, 38 pages.

Carclo Technical Plastics "LUXEON® I 20 & 26.5mm Range", downloaded from the internet at: http://docs-europe.electrocompolielits.com/webdocs/0dcb/0900706b80dcbbeb.pdf on Oct. 30, 2012, 31 pages.

Intematix, "Design Considerations for ChromaLit ™ Ellipse, Candle, and Dome Remote Phosphor Light Sources", Jan. 11, 2012, downloaded from the internet at: http://www.intematix.com/uploads/files/imx-design-considerations-ecd-app-note.pdf, on Oct. 30, 2012, 23 pages.

Intematix, "Mixing Chamber Design Considerations for ChromaLit™ Remote Phosphor Light Sources", Aug. 29, 2012, downloaded from the internet at: http://www.intematix.com/uploads/files/intematix_mixing_chamber_design_for_chromalit.pdf on Oct. 30, 2012, 12 pages.

Liu, et al. "Effects of Phosphor's Location on LED Packaging Performance", 2008 International Conference on Electronic Packaging Technology & High Density Packaging (ICEPT-HDP 2008), 7 pages.

Liu, et al. "Effects of Phosphor's Thickness and Concentration on Performance of White LEDs", 2008 International Conference on Electronic Packaging Technology & High Density Packaging (ICEPT-HDP 2008), 6 pages.

Mims III, Forrest, "Sun Photometer with Light-Emitting Diodes as Spectrally Selective Detectors", Applied Optics 31, 6965-6967, 1992.

Carr et al., "One-Watt GaAs p-n Junction Infrared Source", Applied Physics Letters, vol. 3, No. 10, Nov. 15, 1963, pp. 173-175.

W. N. Carr, "Photometric Figures of Merit for Semiconductor Luminescent Sources Operating in Spontaneous Mode", Infrared Physics, 1966, vol. 6, pp. 1-19.

ILLUMINATION DEVICE WITH MULTI-COLOR LIGHT-EMITTING ELEMENTS

CROSS-REFERENCE TO RELATED APPLICATION

This application is a continuation application and claims priority to U.S. patent application Ser. No. 15/625,953, filed Jun. 16, 2017, which is a continuation of U.S. patent application Ser. No. 14/773,301, filed Sep. 4, 2015, which is a U.S. National Stage of International Application No. PCT/US2014/021778, filed Mar. 7, 2014, which claims the benefit under 35 U.S.C. § 119(e)(1) of U.S. Provisional Application No. 61/774,399, filed on Mar. 7, 2013, which are incorporated by reference herein.

TECHNICAL FIELD

The described technology relates to converting light and mixing the converted light in a light-mixing element.

BACKGROUND

The described technology relates to illumination devices that convert light and mix the converted light in a light-mixing element.

Light sources are ubiquitous in the modern world, being used in applications ranging from general illumination (e.g., light bulbs) to lighting electronic information displays (e.g., backlights and front-lights for LCDs) to medical devices and therapeutics. Solid state light sources, which include light-emitting diodes (LEDs), are increasingly being adopted in a variety of fields, promising low power consumption, high luminous efficacy and longevity, particularly in comparison to incandescent and other conventional light sources.

One example of a solid state light source increasingly being used for in luminaires is a so-called "white LED." Conventional white LEDs typically include an LED that emits blue or ultraviolet light and a phosphor or other luminescent material. The device generates white light via down-conversion of blue or UV light from the LED (referred to as "pump light") by the phosphor. Such devices are also referred to as phosphor-based LEDs (PLEDs). Although subject to losses due to light-conversion, various aspects of PLEDs promise reduced complexity, better cost efficiency and durability of PLED-based luminaires in comparison to other types of luminaires.

While new types of phosphors are being actively investigated and developed, configuration of PLED-based light sources, however, provides further challenges due to the properties of available luminescent materials. Challenges include light-energy losses from photon conversion, phosphor self-heating from Stokes loss, dependence of photon conversion properties on operating temperature, degradation due to permanent changes of the chemical and physical composition of phosphors in effect of overheating or other damage, dependence of the conversion properties on intensity of light, propagation of light in undesired directions in effect of the random emission of converted light that is emitted from the phosphor, undesired chemical properties of phosphors, and controlled deposition of phosphors in light sources, for example.

SUMMARY

The described technology relates to illumination devices that convert light and mix the converted light in a light-mixing element.

Accordingly, various aspects of the invention are summarized as follows.

In general, in a first aspect, the invention features an illumination device for generating output light including a substrate that has a first surface; multiple light sources disposed on the first surface, where at least some of the light sources include a light-emitting diode (LED) and a corresponding inelastic scattering element surrounding, at least in part, the LED, and where at least two inelastic scattering elements have different light emission spectra; and an elastic scattering element surrounding, at least in part, light sources, where, during operation of the illumination device, each inelastic scattering element inelastically scatters light emitted from its corresponding LED, and the elastic scattering element elastically scatters the light that is inelastically scattered by the inelastic scattering elements to provide the output light.

The foregoing and other embodiments can each optionally include one or more of the following features, alone or in combination. In some embodiments at least some of the LEDs emit blue light. In some embodiments at least some of the LEDs emit light having different colors (e.g., blue light and green light.) In some embodiments the inelastic scattering elements include a quantum dot phosphor material. In some embodiments the inelastic scattering elements have a dome shape. In some embodiments each inelastic scattering element is spaced apart from its corresponding LED and has an inner surface facing the LED. At least some of the light sources can include a medium adjacent to the inner surface of the inelastic scattering element that has a refractive index that is smaller than a refractive index of the inelastic scattering element. The medium can be air or a silicone, for example. In some embodiments at least a portion of the first surface is a diffusely reflecting surface and/or a specularly reflecting surface.

In some embodiments, the illumination device further includes electrical connections for connecting the light sources to a power source, where the electrical connections can be arranged such that power to at least some of the plurality of light sources is separately adjustable. In some embodiments, the illumination device further includes electrical connections for connecting the plurality of light sources to a power source, where the electrical connections can be arranged such that power to each of the plurality of light sources is separately adjustable.

In some embodiments the elastic scattering element is spaced apart from the light sources and coupled to the substrate to form an enclosure, where the elastic scattering element can have an input surface facing the light sources and an output surface opposing the input surface. An index of refraction of the elastic scattering element can be larger than an index of refraction of a medium in the enclosure and larger than an index of refraction of an ambient environment. In some embodiments, the illumination device further includes an extractor element coupled to the output surface of the elastic scattering element. An index of refraction of the elastic scattering element can be larger than an index of refraction of a medium in the enclosure. An index of refraction of the elastic scattering element can be larger than an index of refraction of a medium in the enclosure and smaller than an index of refraction of the extractor element. The extractor element can have a transparent exit surface opposing the output surface of the elastic scattering element that can be shaped such that an angle of incidence on the exit surface of the light provided by the elastic scattering element that directly impinges on the exit surface is less than a critical angle for total internal reflection at the exit surface.

In some embodiments, the elastic scattering element can be a coating applied to a surface of the extractor element and/or a roughened surface of the extractor element. In some embodiments, the light sources and the elastic scattering element can be arranged such that light with substantially isotropic chromaticity is output by the elastic scattering element.

In general, in a further aspect, the invention features an illumination device including a substrate having a base surface; two or more light sources disposed on the base surface, where each light source includes a light-emitting element (LEE) configured to emit light and a corresponding inelastic scattering element surrounding, at least in part, the LEE; a first optical element having a first surface spaced apart from the two or more light sources and positioned to receive light from the two or more light sources, where the first optical element includes elastic scattering centers arranged to scatter light received from the two or more light sources; and a second optical element having an exit surface, where the second optical element is transparent and in contact with the first optical element, there being an optical interface between the first and second optical elements at the place of contact, and where the optical interface is opposite the first surface of the first optical element, and where the second optical element is arranged to receive at least a portion of the light through the optical interface. A medium adjacent to the first surface of the first optical element has a refractive index $n_0$; the first optical element includes a material having a refractive index $n_1$, where $n_0 < n_1$; the second optical element includes material having a refractive index $n_2$, where $n_0 < n_2$; the exit surface is a transparent surface that is shaped such that an angle of incidence on the exit surface of the light provided by the first optical element that directly impinges on the exit surface is less than a critical angle for total internal reflection; and during operation of the illumination device, each inelastic scattering element inelastically scatters light emitted from its corresponding LEE, and the elastic scattering element elastically scatters the light that is inelastically scattered by the inelastic scattering elements to provide the output light.

In general, in a further aspect, the invention features an illumination device for generating output light including a substrate having a first surface; multiple light sources disposed on the first surface, where at least some of the light sources include a light-emitting diode (LED) and a corresponding inelastic scattering element surrounding, at least in part, the LED, and where at least two inelastic scattering elements have different light emission spectra; and a light-mixing element adapted to receive light that is output by the light sources, where, during operation of the illumination device, each inelastic scattering element inelastically scatters light emitted from its corresponding LED, and the light-mixing element mixes the light received from the inelastic scattering elements to provide the output light.

The foregoing and other embodiments can each optionally include one or more of the following features, alone or in combination. In some embodiments at least some of the LEDs emit blue light. In some embodiments, at least some of the LEDs emit light having different colors (e.g., blue light and green light.) In some embodiments, the inelastic scattering elements include a quantum dot phosphor material. In some embodiments, the inelastic scattering elements have a dome shape. In some embodiments, each inelastic scattering element is spaced apart from its corresponding LED and has an inner surface facing the LED. At least some of the light sources can include a medium adjacent to the inner surface of the inelastic scattering element that can have a refractive index that is smaller than a refractive index of the inelastic scattering element. In some embodiments, the medium can be air or a silicone. In some embodiments, at least a portion of the first surface can be a diffusely reflecting surface and/or a specularly reflecting surface.

In some embodiments, the illumination device further includes electrical connections for connecting the light sources to a power source, where the electrical connections can be arranged such that power to at least some of the light sources is separately adjustable. In some embodiments, the illumination device further includes electrical connections for connecting the light sources to a power source, where the electrical connections can be arranged such that power to each of the plurality of light sources is separately adjustable.

In some embodiments, the light-mixing element can be a light guide or an elastic scattering element. In some embodiments, the light sources and the light-mixing element can be arranged such that light having substantially isotropic chromaticity is output by the light-mixing element.

In general, in a further aspect, the invention features a method for generating output light, where the method includes disposing multiple light sources on a first surface of a substrate, where at least some of the light sources include a light-emitting diode (LED) and a corresponding inelastic scattering element surrounding, at least in part, the LED, and where at least two of the inelastic scattering elements have different light emission spectra; inelastically scattering light emitted from each LED by its corresponding inelastic scattering element; and mixing the inelastically scattered light by a light-mixing element adapted to receive light that is output by the plurality of light sources.

The foregoing and other embodiments can each optionally include one or more of the following features, alone or in combination. In some embodiments, at least some of the LEDs emit blue light. In some embodiments, at least some of the LEDs emit light having different colors (e.g., blue light and green light.) In some embodiments, the inelastic scattering elements comprise a quantum dot phosphor material. In some embodiments, the inelastic scattering elements have a dome shape. In some embodiments, each inelastic scattering element can be spaced apart from its corresponding LED and has an inner surface facing the LED. At least some of the light sources can include a medium adjacent to the inner surface of the inelastic scattering element that has a refractive index that is smaller than a refractive index of the inelastic scattering element. In some embodiments, the medium can be air or a silicone. In some embodiments, at least a portion of the first surface can be a diffusely reflecting surface and/or a specularly reflecting surface.

In some embodiments, the method further includes arranging electrical connections for connecting the plurality of light sources to a power source such that power to at least some of the plurality of light sources is separately adjustable. In some embodiments, the method further includes arranging electrical connections for connecting the plurality of light sources to a power source such that power to each of the plurality of light sources is separately adjustable. In some embodiments, the light-mixing element can be a light guide or an elastic scattering element. In some embodiments, the method further includes arranging the light sources and the light-mixing element such that light having substantially isotropic chromaticity is output by the light-mixing element.

Amongst other advantages, embodiments of the illumination devices include light sources that can be configured to provide converted pump light with an emission spectrum that can be substantially independent of practically occurring variations in the spectrum of pump light. The illumination devices can further include a scattering element that mixes light which is output by the light sources. The described technology can help stabilizing the emission spectrum and thereby chromaticity and/or color temperature of the light provided by the illumination device.

Reference numbers and designations in the various drawings indicate exemplary aspects of implementations of particular features of the present disclosure.

DETAILED DESCRIPTION

Phosphor-based light sources can suffer losses due to Stokes shift/loss and self-absorption. In addition, combinations of multiple phosphors can cause parasitic losses due to absorption of light in one phosphor that was emitted by another. For example, in some pairs of phosphors, the emission spectrum of one of the phosphors can significantly overlap with the absorption spectrum of the other, as shown, for example, in FIG. 2. Such characteristics can affect quantum dot and other types of phosphors. This can be particularly relevant when designing high color rendering index (CRI) phosphor-based light sources. In such cases, rather than employing a mixture of phosphors, multiple phosphors can be employed separately and the light from them combined such that the combined (mixed) light better matches the Blackbody or other desired radiation spectrum, for example. Separating different types of phosphors furthermore can allow for independent selection of pump light sources. As such and depending on the properties of phosphors, pumping different phosphors with different spectra pump light can allow for reduced Stokes shifts and increased light conversion efficiencies.

As used herein a phosphor absorbs photons according to a first spectral distribution and emits photons according to a second spectral distribution. Wavelength conversion characteristics of a phosphor can include the first and second spectral distributions, their dependence on each other, on the temperature of the phosphor, the amount of light to which the phosphor is exposed, and/or other wavelength conversion characteristics of the phosphor, for example. Further details are described in connection with FIGS. 2 and 3. The terms light conversion, wavelength conversion and/or color conversion are used interchangeably. The term "phosphor" may also refer to a photoluminescent, light-converting, color-converting or inelastic scattering material, for example. Phosphors can include photoluminescent substances, fluorescent substances, quantum dots, semiconductor-based optical converters, or the like. Phosphors can include rare earth elements.

Figure 1:
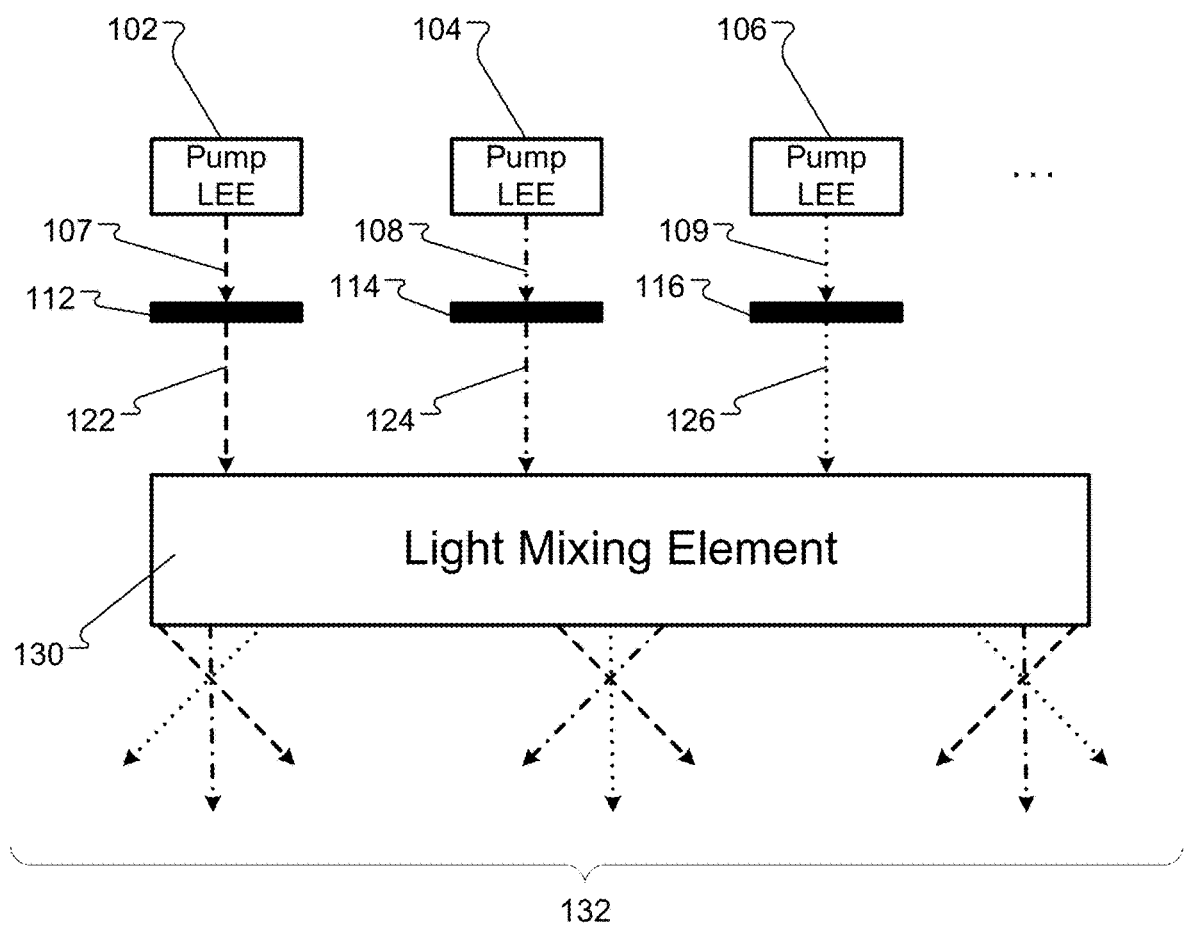
FIG. 1 is a schematic diagram of an example illumination device including a light-mixing element.

FIG. 1 is a schematic diagram of an example illumination device 100 including a light-mixing element. The illumination device 100 includes multiple light sources and a light-mixing element 130 (e.g., a symmetric or asymmetric light valve, a light guide, or other optical mixing element). Each light source includes a pump light-emitting element (LEE), such as LEEs 102, 104, and 106, that is at least partially surrounded by a respective inelastic scattering element (e.g., phosphor or quantum dot) such as inelastic scattering element 112, 114, and 116 respectively. The LEEs 102, 104, and 106 are configured to provide pump light having emission spectra 107, 108, and 109 respectively that is inelastically scattered in corresponding inelastic scattering elements 112, 114, and 116.

A spectral power distribution of light emitted by a light-emitting element (also referred to as pump light) can be blue, for instance. The spectral power distribution for visible light is referred to as chromaticity. In general, a light-emitting element is a device that emits radiation in a region or combination of regions of the electromagnetic spectrum for example, the visible region, infrared and/or ultraviolet region, when activated by applying a potential difference across it or passing a current through it, for example. A light-emitting element can have monochromatic, quasi-monochromatic, polychromatic or broadband spectral emission characteristics. Examples of light-emitting elements that are monochromatic or quasi-monochromatic include semiconductor, organic, polymer/polymeric light-emitting diodes (LEDs). In some implementations, a light-emitting element can be a single specific device that emits the radiation, for example a LED die, or a combination of multiple instances of the specific device that emit the radiation together. Such light-emitting elements can include a housing or package within which the specific device or devices are placed. As another example, a light-emitting element can include one or more lasers (e.g., semiconductor lasers, such as vertical cavity surface emitting lasers (VC-SELs) and edge emitting lasers.) In embodiments with semiconductor lasers, a scattering element functions to reduce (e.g., eliminate) spatial and temporal coherence of laser light, which may be advantageous where the light emitting element may be viewed directly by a person. Further examples of light-emitting elements include super-luminescent diodes and other superluminescent devices.

The inelastic scattering elements 112, 114, and 116 inelastically scatter the received light and are configured to provide light having different emission spectra 122, 124, and 126 respectively, during operation. The emission spectra 122, 124, and 126 of the different light sources can be based on like or different color pump LEEs that output light into their respective inelastic scattering elements. For example, the spectral power distributions (SPDs) of light emitted by the LEEs 102, 104, and/or 106 can be the same or different. Furthermore, SPDs of the pump LEEs can include peaks in blue, green, yellow, red, or other colors, and any combination thereof. The light that is output from the inelastic scattering elements 112, 114, and 116 is received by the light-mixing element 130. The light-mixing element 130 is configured to partially or fully mix the received light and provide light with a mixed emission spectrum 132. Depending on the implementation, the light-mixing element can be provided by one element or a combination of multiple elements. For example, the light-mixing element can be formed, at least in part, by an elastic scattering element or by a light guide.

Figure 2:
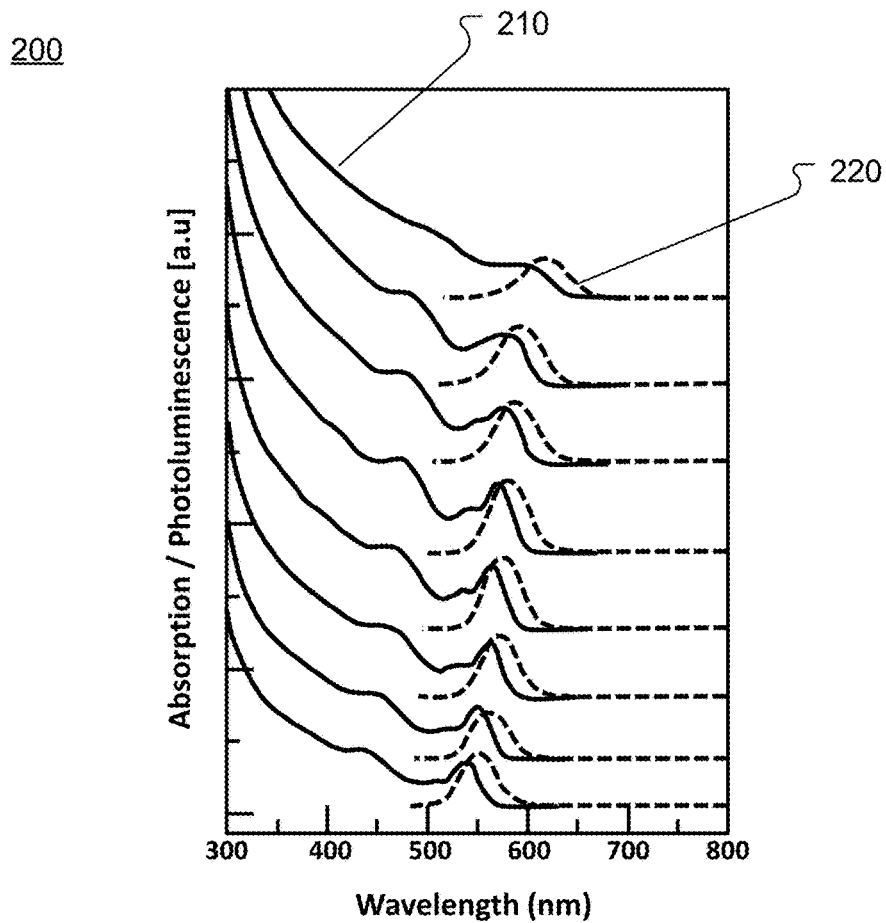
FIG. 2 is a graph showing examples of normalized emission spectra of quantum dot phosphors.

FIG. 2 is a graph 200 showing a series of absorption (solid lines) and emission (dashed lines) spectra of quantum dot phosphors separated vertically for clarity. For example, a first quantum dot phosphor is characterized by the absorption spectrum 210 and the emission spectrum 220. As shown in the graph 200, the absorption spectrum 210 can overlap, at least in part, with the emission spectrum 220. Furthermore, the absorption spectrum 210 can also overlap, at least in part, with emission spectra of other quantum dot phosphors. The overlap between emission and absorption spectra can cause parasitic losses from self or mutual absorption of light, particularly at shorter wavelength ranges. According to an aspect of the present technology, mutual absorption of light can be controlled by spatially separating different phosphors.

Figure 3:
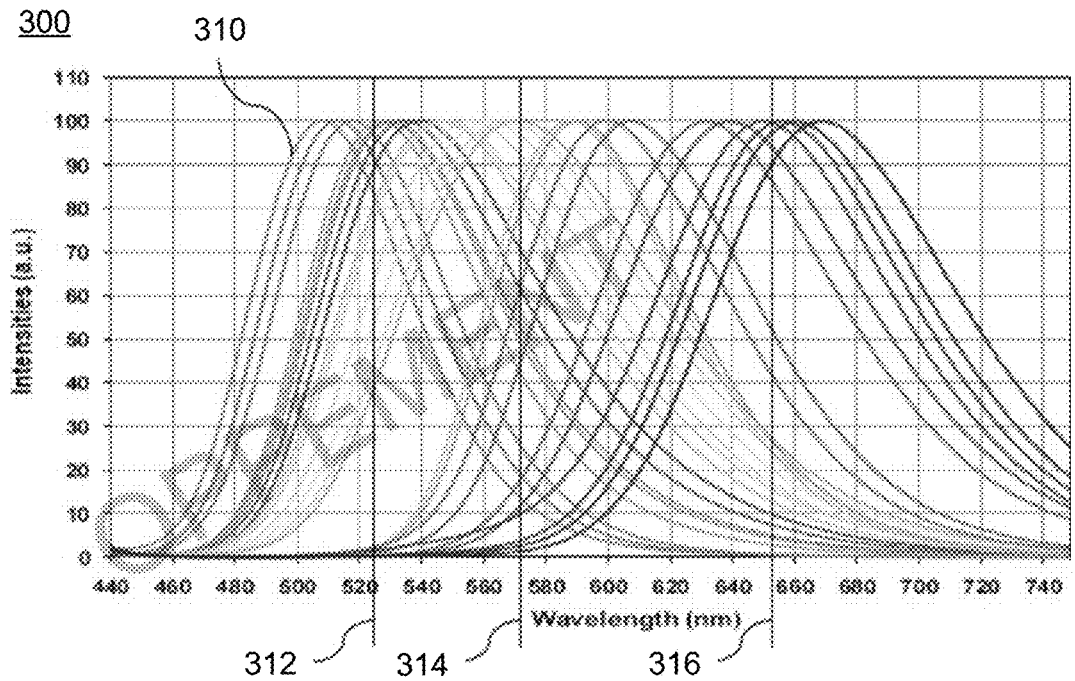
FIG. 3 is a graph showing examples of normalized emission spectra of different types of phosphors.

FIG. 3 is a graph 300 showing examples of normalized emission spectra 310 of different types of phosphors. For example, dependent on the type, a phosphor can produce light within a green emission spectrum (in the vicinity of marker 312), a yellow emission spectrum (in the vicinity of marker 314), a red emission spectrum (in the vicinity of marker 316), or a combination of a green, yellow, and red emission spectrum. In combination, multiple phosphors can be used to control color temperature (e.g., chromaticity) of mixed light emitted from the phosphors. Furthermore, multiple phosphors may be selected whose light, when mixed properly, may approximately match a desired spectral distribution. As such, the mixed light, when used for illumination purposes, may provide good color rendering properties. When pumped with multiple like light-emitting elements (LEEs), for example, blue or other short wavelength light-emitting diodes (LEDs), differential thermal properties of such systems can be dominated by differential thermal properties of the phosphor.

In contrast, systems with different color LEEs that are capable of generating different color light without the use of phosphors (quantum dot or otherwise) can have significantly different thermal characteristics which may be due to the materials used in such different color LEEs. Such LEEs may also produce light having narrow emission spectra. Systems based on them can exhibit complex non-linear behavior and therefore may require cost prohibitive, color control mechanisms based on electrical, thermal and/or optical feed-forward and/or feedback. Furthermore, color performance and lumen output of such color LEEs may be limited (e.g., for presently available green LEDs), which may limit their utility for space illumination applications.

According to the present technology, several multi-color phosphors can be employed in combination with multiple light-emitting elements (LEEs), for example blue or other color LEEs, to produce different color converted light. Light from the phosphors, both converted and unconverted, if any, is then injected into suitable optical systems for mixing such as a symmetric or asymmetric light valve, a light guide or other optical mixing element. Such systems allow for high quality color rendering and/or color control/maintenance during operation. In some implementations, the LEEs can be light-emitting diodes (LEDs).

Figure 4A:
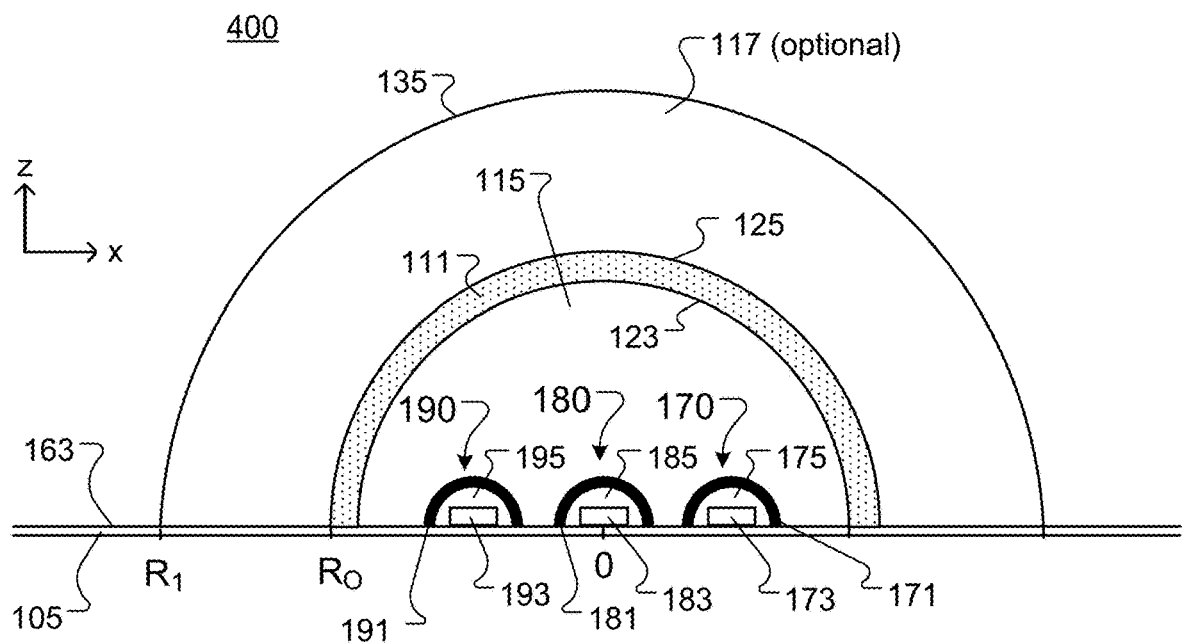
FIGS. 4A-4B are cross-sectional views of an example of an illumination device with different light sources and an elastic scattering element.
Figure 4B:
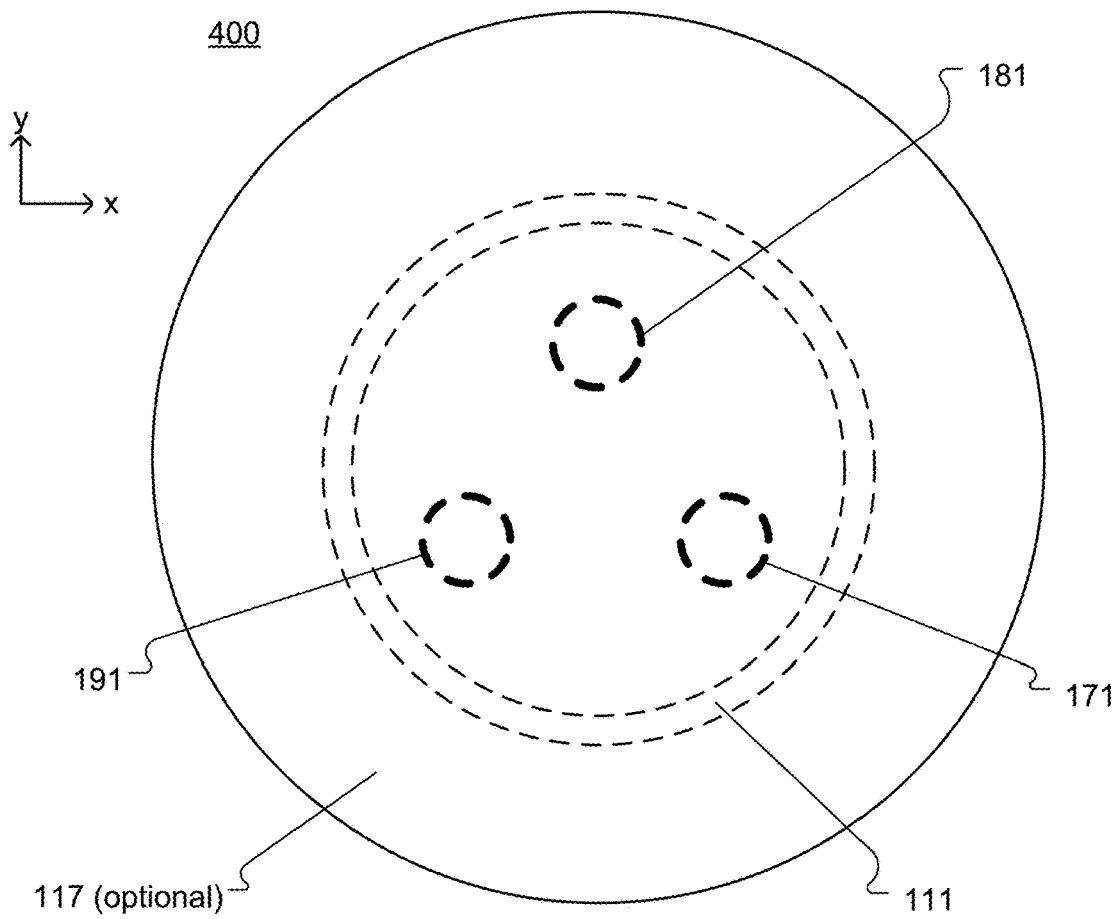

FIGS. 4A and 4B are cross-sectional views of an example of an illumination device 400. FIG. 4A shows a side sectional view of a portion of the illumination device 400. FIG. 4B shows a top sectional view of an inner portion of the illumination device 400. The example illumination device 400 includes a substrate 105 and three light sources 170, 180, and 190 disposed on a surface 163 of the substrate 105. Each of the light sources 170, 180 and 190 includes a pump LEE at least partially surrounded by a respective inelastic scattering element 171, 181 and 191, such as a phosphor or quantum dot (e.g., shaped as a dome or other configuration). The substrate 105 can extend within the x-y plane up to (not illustrated) or beyond point R1. The surface 163 can be provided by a reflective layer (not illustrated) that can be wider or narrower in the x-y plane than the substrate 105. Furthermore, the substrate 105 can be disposed on a reflective layer.

The spaces 175, 185, and 195 between the inelastic scattering elements 171, 181 and 191 and the corresponding pump LEEs 173, 183, and 193, can be filled with a low or high refractive index medium (e.g., air or a silicone). The surface 163 can be diffuse and/or specular reflective. The reflective properties of the surface 163 can be uniform across the extension of or depend on the location on the surface 163.

The illumination device 400 can further include an extractor 117 and an elastic scattering element 111 (including only elastic scattering centers.) The extractor 117 is formed from a transparent material and has a transparent exit surface 135. The elastic scattering element 111 can be located on the inside of the extractor 117 and form an optical interface 125. In some implementations, the elastic scattering element 111 can be a layer (e.g., coating) with elastic scattering centers. In some implementations, the elastic scattering element 111 can be a roughening of the inner surface of the extractor 117. The extractor 117 can abut surface 163 of the substrate 105 forming a recovery enclosure. In some implementations, the surface 163 can be reflective. The surface 163 can be arranged to redirect light emitted by light sources 170, 180, and 190, and/or light reflected by the elastic scattering element 111. In some implementations, the light sources 170, 180, and 190, the elastic scattering element 111, and the extractor 117, can be disposed on the same surface of the substrate 105.

The light sources 170, 180, and 190 are configured to provide light having different emission spectra during operation. The emission spectra of the different light sources can be based on like or different color pump LEEs 173, 183 and 193 that output light into their respective inelastic scattering elements 171, 181 and 191. For example, the spectral power distribution of light emitted by the LEEs 173, 183 and 193 can be the same, can be blue, green, or red, or another combination. The elastic scattering element 111 has a surface 123 facing the light-emitting elements (also referred to as a light-entry surface) that is spaced apart from, and positioned to receive the light output from the light sources 170, 180, and 190. The elastic scattering element 111 includes elastic scattering centers, which can be arranged to substantially isotropically scatter the light from light sources 170, 180, and 190. The elastic scattering element 111 provides mixed light into the extractor 117. In some implementations, the illumination device 400 includes additional light sources having the same or different emission spectra as the light sources 170, 180, and 190. In this case, the elastic scattering centers of the elastic scattering element 111 can be configured to scatter the light from the additional light sources to aid in the mixing of light.

Depending on the implementation, medium 115 can be a gaseous or other medium having a refractive index $n_{115}$ that is greater or equal to 1 and smaller or equal to a refractive index $n_{111}$ of the elastic scattering element 111 ($1 \leq n_{115} \leq n_{111}$), or the medium 115 can have a refractive index $n_{115}$ that is greater or equal to a refractive index $n_{111}$ of the elastic scattering element 111 ($n_{115} \geq n_{111}$). The refractive index of the medium 115 may have a refractive index comparable to the refractive indices of the inelastic scattering elements 171, 181, 191, for example. The medium 115 surrounds the light sources 170, 180, and 190 and separates the light sources from the elastic scattering element 111. In some implementations, the medium 115 can be of a high refractive index material (for example, a solid or a liquid).

A refractive index of the extractor 117 can be greater, equal, or smaller than a refractive index of the elastic scattering element 111.

According to one implementation, the spaces 175, 185 and 195 are filled with gas, and medium 115, elastic scattering element 111, and extractor 117 have like refractive indices. According to another implementation, spaces 175, 185, 195 are filled with gas and medium 115 is gas.

In some implementations that include an extractor, the exit surface 135 of the extractor 117 is shaped as a spherical or a cylindrical dome or shell with a radius R1 in which the optical interface is disposed within an area defined by a respective notional sphere or cylinder that is concentric with the exit surface and has a radius $R_{OW}=R1/n_{117}$, wherein $n_{117}$ is the refractive index of the extractor 117. Such a configuration is referred to as Weierstrass geometry or Weierstrass configuration. It is noted that a spherical Weierstrass geometry can avoid total internal reflection (TIR) for rays passing through the area circumscribed by a corresponding notional $R1/n_{117}$ sphere irrespective of the plane of propagation. A cylindrical Weierstrass geometry can exhibit TIR for light that propagates in planes that intersect the respective cylinder axis at shallow angles even if the light passes through an area circumscribed by a corresponding notional $R_{OW}=R1/n_{117}$ cylinder.

It is noted that other illumination devices have exit surfaces with other shapes and/or other geometrical relations with respect to the optical interface. For instance, a non-spherical or non-cylindrical exit surface of the extractor 117 can be employed to refract light and aid in shaping an output intensity distribution in ways different from those provided by a spherical or cylindrical exit surface. The definition of the Weierstrass geometry can be extended to include exit surfaces with non-circular sections by requiring that the optical interface falls within cones, also referred to as acceptance cones, subtended from points p of the exit surface whose axes correspond to respective surface normals at the points p and which have an apex of 2*Arcsin($k/n_{117}$), wherein k is a positive number smaller than $n_{117}$. It is noted that the exit surface needs to be configured such that the plurality of all noted cones circumscribe a space with a non-zero volume. It is further noted that k is assumed to refer to a parameter that determines the amount of TIR at an uncoated exit surface that separates an optically dense medium, having $n_{117}>1$, on one side of the exit surface making up the extractor 117 from a typical gas such as air with n~1.00 at standard temperature and pressure conditions, on the opposite side of the exit surface. Depending on the embodiment, k can be slightly larger than 1 but is preferably less than 1. If k>1, some TIR may occur at the exit surface inside the extractor 117. In some embodiments, this results in the optical interface being at least R(p)*(1-k/$n_{117}$) away from the exit surface in a direction normal to the exit surface at a point p thereof. Here, R(p) is the local radius of curvature of the exit surface at the point p, and $n_{117}$ is the refractive index of the extractor 117. For a spherical or cylindrical exit surface with k=1, the boundaries circumscribed by the noted cones correspond with a spherical or cylindrical Weierstrass geometry, respectively. Some embodiments are configured to allow for some TIR by choosing k>1. In such cases, $k/n_{117}$ is limited to $k/n_{117}<0.8$, for example.

In summary, an illumination device is said to satisfy the Weierstrass configuration if a radius $R_O$ of the optical interface is less than or equal to $R_O \leq R_{OW}=R1/n_{117}$, where R1 and $n_{117}$ respectively are the radius and index of refraction of the extractor 117. Equivalently, the extractor 117 of an illumination device is said to satisfy the Weierstrass configuration if a radius $R_1$ of an extractor 117, which has an index of refraction $n_{117}$, is equal to or larger than $R_1 \geq R_{1W}=n_{117}R_O$, where $R_O$ is the radius of the optical interface of the illumination device.

In some implementations, the exit surface 135 of the extractor 117 can have a radius $R_1$ that is concentric with the optical interface 125, such that the extractor 117 satisfies the Brewster configuration $R_1 \geq R_{1B}$. The Brewster radius is given by $R_{1B}=R_O(1+n_{117}^2)^{+1/2}$ where $R_O$ is the radius of the optical interface 125 of the illumination device 400, and $n_{117}$ denotes the index of refraction of the material of the extractor 117. As the extractor 117 satisfies the Brewster configuration, an angle of incidence on the exit surface 135 of the scattered light that directly impinges on the exit surface 135 is less than the Brewster angle, and as such, the scattered light that directly impinges on the exit surface 135 experiences substantially no total internal reflection and limited Fresnel reflections thereon.

In the example illumination device illustrated in FIG. 4A, light propagation asymmetry arises, for example, from the materials on the inside (index $n_{115}$) and outside (e.g., index $n_{117}$) of the elastic scattering element 111 with index $n_{111}$ being unequal. For instance, if $n_{111}=1.5$ and $n_{115}=1.0$, that is $n_{115}<n_{111}$, a large fraction (~75%) of the isotropically distributed photons impinging on the surface 123 of the elastic scattering element 111 will be reflected by total internal reflection (TIR) back into the elastic scattering element 111 and only a smaller fraction (~25%) will be transmitted backwards into a recovery enclosure from where some may reach the light sources. At the optical interface 125, the condition $n_{111} \leq n_{117}$ will guarantee that substantially all photons reaching the optical interface 125 will transition into the extractor 117, and the Brewster condition will further guarantee that practically all these photons will transmit into the ambient environment without TIR through the exit surface 135. Only a small fraction (down to about ~4% depending on incidence angle) will be returned by Fresnel reflection at the exit surface 135.

The pump LEEs 173, 183, and 193 can be separated by a medium in spaces 175, 185, and 195 (e.g., a low-index medium) from corresponding inelastic scattering elements 171, 181, and 191 to maintain efficient light conversion with small light sources. In some implementations, the pump LEEs 173, 183, and 193 can have the same color (e.g., blue). In some implementations, the pump LEEs 173, 183, and 193 can have different colors, (e.g., violet, blue, green, yellow, red, etc.)

Depending on the implementation, a pump LEE and a corresponding phosphor can be paired in such a way that the combination can provide certain optical, thermal, electrical or other properties including a desired conversion efficiency, spectral power distribution, temperature dependence of the optical properties, or other properties. It is noted that a phosphor may be combined with pump LEEs that emit light close to the photoluminescence peaks of the phosphor they are pumping. Such a combination can provide light of a broader emission spectrum than the pump LEE alone while exhibiting little Stokes loss for the converted light.

The inelastic scattering elements 171, 181, and 191 can be configured to emit light with an average red, yellow and green color, for example, respectively. In some implementations, each of the inelastic scattering elements can be configured to provide converted light with an emission spectrum that can be substantially independent of certain variations in the spectrum of the pump light. For example, if a change in operating temperature of a pump LEE changes the center wavelength of its light, the emission spectrum of the phosphor or relevant luminous figures derived from it may remain substantially constant. Corresponding illumination devices may provide light of relatively stable color. As such and depending on the implementation, chromaticity and/or correlated color temperature of the light provided by the illumination device may vary little with temperature.

As noted herein, different inelastic scattering elements can be pumped with different types of LEEs which can provide light of different center wavelengths. For example, a LEE 193 can be a blue LEE or a green LEE, which can help reduce Stokes loss due to the smaller wavelength difference in comparison to the blue LEE. Like considerations can apply to the other light sources of the illumination device. As such the illumination device can be configured to provide good color stability of the output light with greater resilience to variations in operating conditions of its components.

The design of light sources can be scaled to a size approaching that of conventional light-emitting diodes (LEDs.) The package size of the light sources is ultimately limited by the size of the pump LEE. The distance of the phosphor from the pump LEE determines the fraction of mixed light that re-enters the pump LEEs. Pump LEEs can absorb large fractions of received light and cause high light losses. Systems with larger distances provide smaller losses. For example, for a pump LEE having an area of ~1 mm$^2$, less than 1% of phosphor light emitted from the phosphor re-enters the pump LEE, if a minimum pump LEE to phosphor separation of approximately $\sqrt{1\text{mm}^2/(4\pi(0.01))}$, that is ~2.8 mm is maintained. Furthermore, less than 1% of light from such an example light source (2.8 mm radius hemisphere plus 0.4 mm phosphor thickness provides 16 mm$^2$ cross section) reaches another light source, if the distance between them is the light sources is larger than approximately $\sqrt{16\text{mm}^2/(4\pi(0.01))}$, that is ~11 mm. Like considerations apply when estimating amounts of light back-scattered from the elastic scattering element to the inelastic scattering elements.

In some implementations, the inelastic scattering elements can be configured to provide isotropically or non-isotropically scattered light. Effects of non-isotropically scattered light, for example light with substantial forward component that may include a substantial amount of pump light, can be mixed with light from the other light sources via the elastic scattering element 111 in combination with the medium 115.

The extractor 117 and the elastic scattering element 111 can have a hemispherical or other spherical or non-spherical shape with a curved and/or facetted exit surface.

In some implementations, asymmetric light propagation and good light mixing can be achieved via a solid medium 115, small solid angles subtended among the light sources 170, 180, and 190, and small solid angles subtended by the light sources from the elastic scattering element 111. The chromaticity of the light emitted by the illumination device can be adjusted by combining a suitable number of different light sources with different phosphor elements. The illumination device can be configured to provide light of substantially isotropic chromaticity.

During changes of the thermal operating conditions or in effect of aging of the illumination device 400, changes in the chromaticity and/or the amount of light provided can be smaller than in systems with different color LEEs that are capable of generating different color light without the use of phosphors due to fewer differential thermal properties of the components used in the illumination device as described herein. Such effects can be compensated for via suitable feed forward or feedback control of the amount of power provided to each of the LEEs of the illumination device.

In some implementations (not illustrated), the light sources 170, 180, and 190 can be configured as individual asymmetric light valve (ASLV) components, and the medium 115 of the illumination device 400 can be a low-index medium (e.g., a gas or air).

In general, one aspect of the disclosed technologies can be implemented as an illumination device which includes a base substrate having a base surface; two or more light sources disposed on the base surface, where each light source includes a light-emitting element (LEE) configured to emit light and an inelastic scattering element surrounding, at least in part, the LEE; a first optical element (e.g., an elastic scattering element) that has a first surface spaced apart from the LEEs and positioned to receive light from at least one of the LEEs, where the first optical element includes elastic scattering centers arranged to scatter light from the LEEs; and a second optical element (e.g., an extractor element) that has an exit surface, where the second optical element is transparent and in contact with the first optical element, there being an optical interface between the first and second optical elements at the place of contact, where the optical interface is opposite the first surface of the first optical element, and where the second optical element is arranged to receive at least a portion of the light through the optical interface. A medium adjacent to the first surface of the first optical element has a refractive index $n_0$; the first optical element includes a material that has a first refractive index $n_1$, where $n_0<n_1$; the second optical element includes a material that has a refractive index $n_2$, where $n_0<n_2$; and the exit surface is a transparent surface that is shaped such that an angle of incidence on the exit surface of the light provided by the first optical element that directly impinges on the exit surface is less than a critical angle for total internal reflection.

In some implementations, the stability of color output for each light source can be determined by inelastic scattering elements 171, 181, and 191, and the respective pump LEEs 173, 183, and 193, particularly when no different color primary LEEs are used. In some implementations, the parasitic losses in the inelastic scattering elements (e.g., phosphor domes) of the described illumination devices can be lower than in devices using only one inelastic scattering element. The spatial separation into multiple inelastic scattering elements with different emission spectra, which in superposition can provide a good match of a predetermined high CRI spectrum, such as that of a black body radiator, can enable generation of light with high CRI and reduce or avoid issues of phosphor-based solid-state lighting (SSL) systems that seek to achieve similar results with one inelastic scattering element.

Implementations of the described embodiments can achieve effective thermal coupling between the pump LEEs 173, 183, and 193, the medium 115, and extractor 117, and therefore improve heat dissipation of the illumination device 400, even when materials used for the medium 115 and extractor 117 have limited heat conductivity. Good thermal coupling between the LEEs as primary heat sources and the inelastic scattering elements as secondary heat sources can provide a short time to reach thermal equilibrium of the illumination device during operating conditions. The inelastic scattering elements 171, 181, and 191 can be thermally coupled, for example via medium 115, elastic scattering element 111, and extractor 117, to dissipate heat, which can help maintain acceptable operating temperatures.

In some implementations, the illumination device 400 can include a sensor system configured to determine the chromaticity/chromaticities of the light emitted by one or more of the light sources, either separately or as mixed light. The sensor can be coupled with a control loop that can be configured to dim the color or brightness of individual light sources, for example when some light sources degrade less over time than others. For example, when the inelastic scattering elements and/or the LEEs age, light emitted from the illumination device can gradually shift chromaticity. A suitable control mechanism can maintain a substantially stable chromaticity and overall light output of the illumination device. Furthermore, two illumination devices can be controlled to provide light of substantially the same chromaticity and/or overall amount of light.

While the illumination device 400 shown in FIGS. 4A and 4B includes an extractor element, illumination devices without an extractor element are also possible. Generally, light from the elastic scattering element (e.g., elastic scattering element 111) may be output directly into the ambient environment without first passing through an extractor element.

In implementations of illumination devices with an extractor element, the refractive index of the extractor element can be larger, equal, or smaller than the refractive index of the elastic scattering element. A refractive index of materials used in the extractor element and the elastic scattering element are generally larger than the refractive index of gaseous ambient environments such as air. This may not be the case if the ambient environment is a liquid, for example, when an illumination device is used in water.

Figure 5:
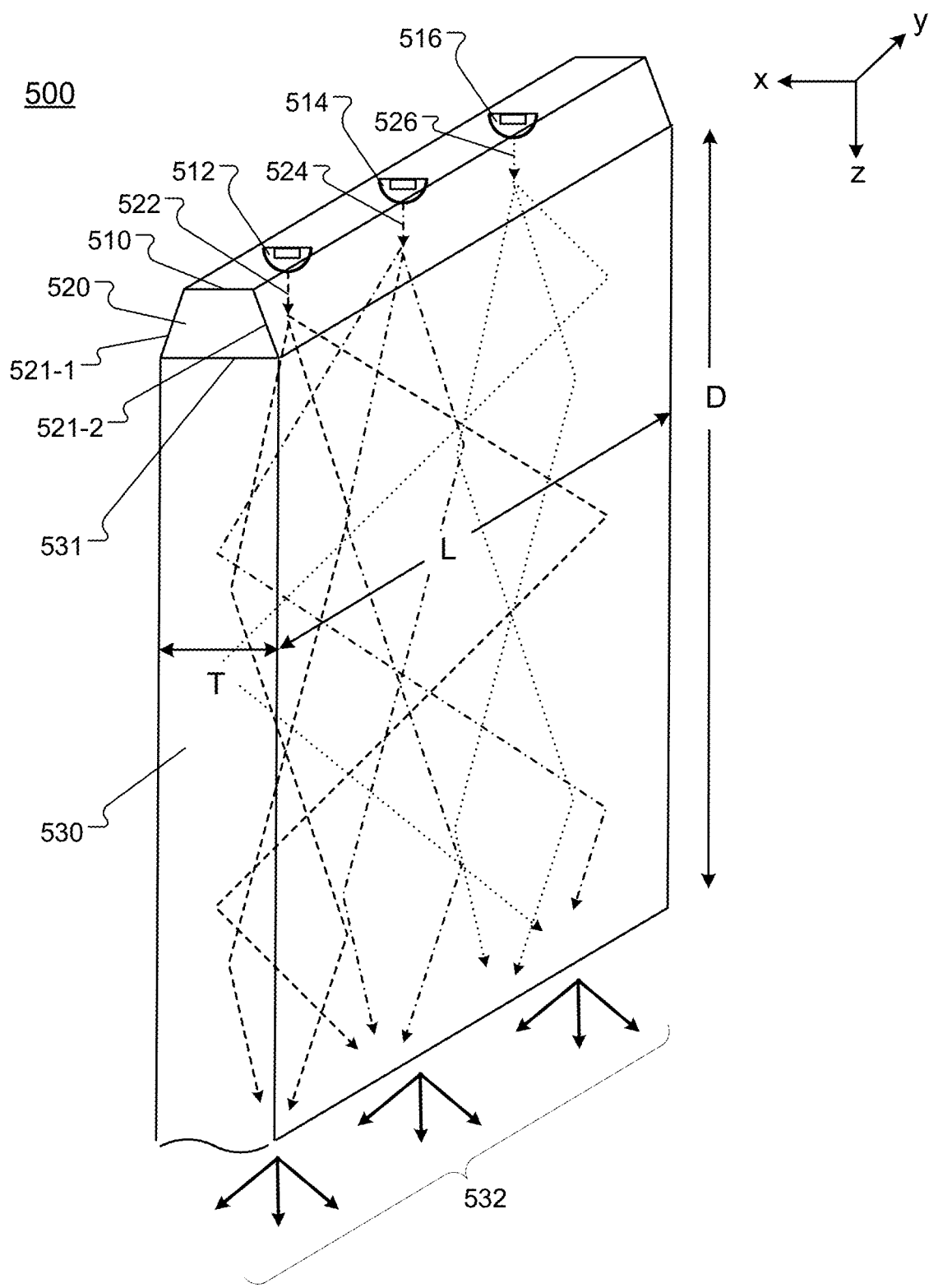
FIG. 5 is a perspective view of an example of an illumination device with different light sources and a light guide.

FIG. 5 is a perspective view of an example of an illumination device 500 including an optical coupler 520 and a light guide 530 for mixing light that is output by three light sources 512, 514, and 516. The light sources 512, 514, and 516 are distributed along a substrate 510 of the optical coupler 520. The illumination device 500 extends along the y-direction, so this direction is referred to as "longitudinal" direction of the illumination device. Other examples include non-longitudinal implementations. Such implementations may have continuous or discrete symmetry about an optical axis or have no such symmetry. The substrate 510 and light guide 530 extend a length L along the y-direction. Generally, L can vary as desired. Typically, L is in a range from about 1 cm to about 200 cm (e.g., 20 cm or more, 30 cm or more, 40 cm or more, 50 cm or more, 60 cm or more, 70 cm or more, 80 cm or more, 100 cm or more, 125 cm or more, 150 cm or more).

The number of light sources disposed on the substrate 510 generally depends, inter alia, on the length L, where more light sources are used for longer illumination devices. In some embodiments, the illumination device can include between 10 and 1,000 light sources (e.g., about 50, about 100, about 200, about 500 light sources). Non-longitudinal illumination devices may include fewer than ten light sources. Generally, the density of light sources (e.g., number of light sources per unit length) will also depend on the nominal power of the light sources and luminance desired from the illumination device. For example, a relatively high density of light sources can be used in applications where high luminance is desired or where low power light sources are used. In some embodiments, the lumination device 500 has a light source density along its length of 0.1 light sources per centimeter or more (e.g., 0.2 per centimeter or more, 0.5 per centimeter or more, 1 per centimeter or more, 2 per centimeter or more). In some embodiments, light sources can be evenly spaced along the length, L, of the illumination device.

Depending on the implementation, light sources may be arranged along the length L in a periodic sequence by chromaticity/color or otherwise. For example, a periodic base sequence with three colors RGY may be used. That is, while progressing along the length L, a red light source is followed by a green light source, which is followed by a yellow light source, which again is followed by a red light source, which is followed by a green light source, and so forth. The sequence may be strictly periodic or employ permutations of the base sequence. Proximate arrangements of different types of light sources allow for shorter depths D of the light guide to achieve greater levels of light mixing at the distal end of the light guide. While a larger base sequence with more colors allows for more permutations, proximity of light sources and depth requirements for the light guide to achieve a desired mixing may dictate strict periodicity or limit permutations of the base sequence in some illumination devices.

The light sources 512, 514, and 516 are configured to provide light having different emission spectra 522, 524, and 526 respectively, as noted above with respect to FIG. 4A and light sources 170, 180 and 190. As also described above, the emission spectra 522, 524, and 526 of the different light sources can be based on like or different color pump LEEs that output light into their respective inelastic scattering elements. For example, the spectral power distribution of light emitted by the LEEs 512, 514, and 516 can be the same, can be blue, green, or red, or another combination.

The optical coupler 520 includes one or more solid pieces of transparent material (e.g., glass or a transparent organic plastic, such as polycarbonate or acrylic) having surfaces 521-1 and 521-2 positioned to reflect light from the light sources towards light guide 530. In general, surfaces 521-1, 521-2 are shaped to collect and collimate light output from the light sources. In the x-z cross-sectional plane, surfaces 521-1, 521-2 can be straight or curved. Examples of curved surfaces include surfaces having a constant radius of curvature, parabolic or hyperbolic shapes. In some embodiments, surfaces 521-1, 521-2 are coated with a highly reflective material (e.g., a reflective metal, such as aluminum), to provide a highly reflective optical interface. The cross-sectional profile of optical coupler 520 can be uniform along the length L of the illumination device 500. Alternatively, the cross-sectional profile can vary. For example, surfaces 521-1, 521-2 can be curved out of the x-z plane.

The surface of optical coupler 520 adjacent to light input surface 531 of the light guide 530 is optically coupled to the light input surface 531. The surfaces of the interface are attached using a material that substantially matches the refractive index of the material forming the optical coupler 520 or light guide 530, or both. For example, optical coupler 520 can be affixed to light guide 530 using an index matching fluid, grease, or adhesive. In some embodiments, optical coupler 520 is fused to light guide 530 or they are integrally formed from a single piece of material.

Light guide 530 is formed from a piece of transparent material (e.g., glass or a transparent organic plastic, such as polycarbonate or acrylic) that can be the same or different from the material forming optical couplers 520. Light guide 530 extends length L in the y-direction. In the illustrated example, the light guide has a uniform thickness T in the x-direction, and a uniform depth D in the z-direction. Other examples can have non-uniform thickness and/or depth. The dimensions D and T are generally selected based on the desired optical properties of the light guide. During operation, light coupled into the light guide from optical coupler 520 (depicted by rays 522, 524, and 526) reflects off the planar surfaces of the light guide by TIR and mixes within the light guide 530. The mixing facilitates luminance and/or color uniformity at the distal portion of the light guide 530 (depicted by rays 532.) The depth, D, of light guide 530 can be selected to achieve adequate uniformity at the exit aperture of the light guide. In some embodiments, D is in a range from about 1 cm to about 20 cm (e.g., 2 cm or more, 4 cm or more, 6 cm or more, 8 cm or more, 10 cm or more, 12 cm or more.)

In general, optical couplers 520 are designed to restrict the angular range of light entering the light guide 530 (e.g., to within +/−40 degrees) so that at least a substantial amount of the light is coupled into spatial modes in the light guide 530 that undergoes TIR at the planar surfaces. Light guide 530 has a uniform thickness T, which is the distance separating two planar opposing surfaces of the light guide. Generally, T is sufficiently large so the light guide has an aperture at the light input surface 531 sufficiently large to approximately match (or exceed) the aperture of optical coupler 520. In some embodiments, T is in a range from about 0.05 cm to about 2 cm (e.g., about 0.1 cm or more, about 0.2 cm or more, about 0.5 cm or more, about 0.8 cm or more, about 1 cm or more, about 1.5 cm or more.) Depending on the embodiment, the narrower the light guide the better it may mix light. A narrow light guide also provides a narrow exit aperture. As such light emitted from the light guide can be considered to resemble the light emitted from a one-dimensional linear light source, also referred to as an elongate virtual filament.

While optical coupler 520 and light guide 530 as shown in FIG. 5 are formed from solid pieces of transparent material, hollow structures are also possible. For example, the optical coupler 520 or the light guide 530, or both, may be hollow with reflective inner surfaces. As such material cost can be reduced and absorption in the light guide avoided. A number of specular reflective materials may be suitable for this purpose including materials such as 3M Vikuiti™ or Miro IV™ sheet from Alanod Corporation where greater than 90% of the incident light would be efficiently guided to the distal end of the light guide.

Figure 6A:
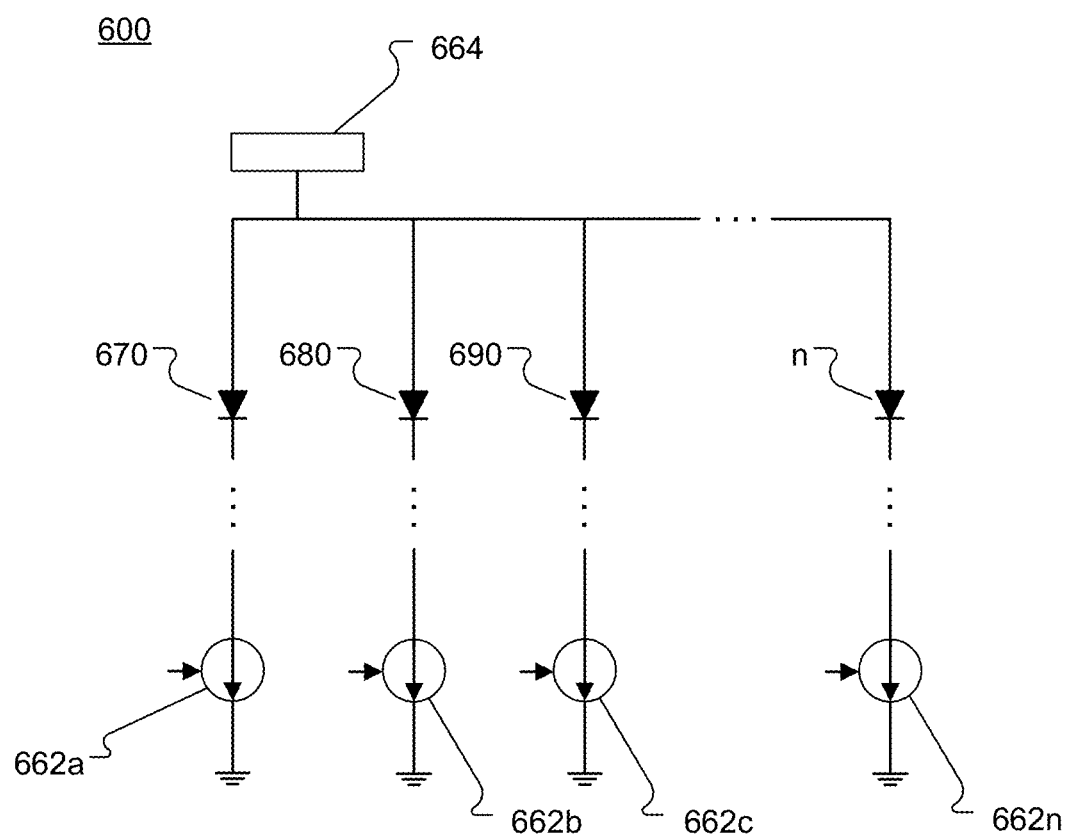
FIGS. 6A-6B are examples of control circuitry for an illumination device.
Figure 6B:
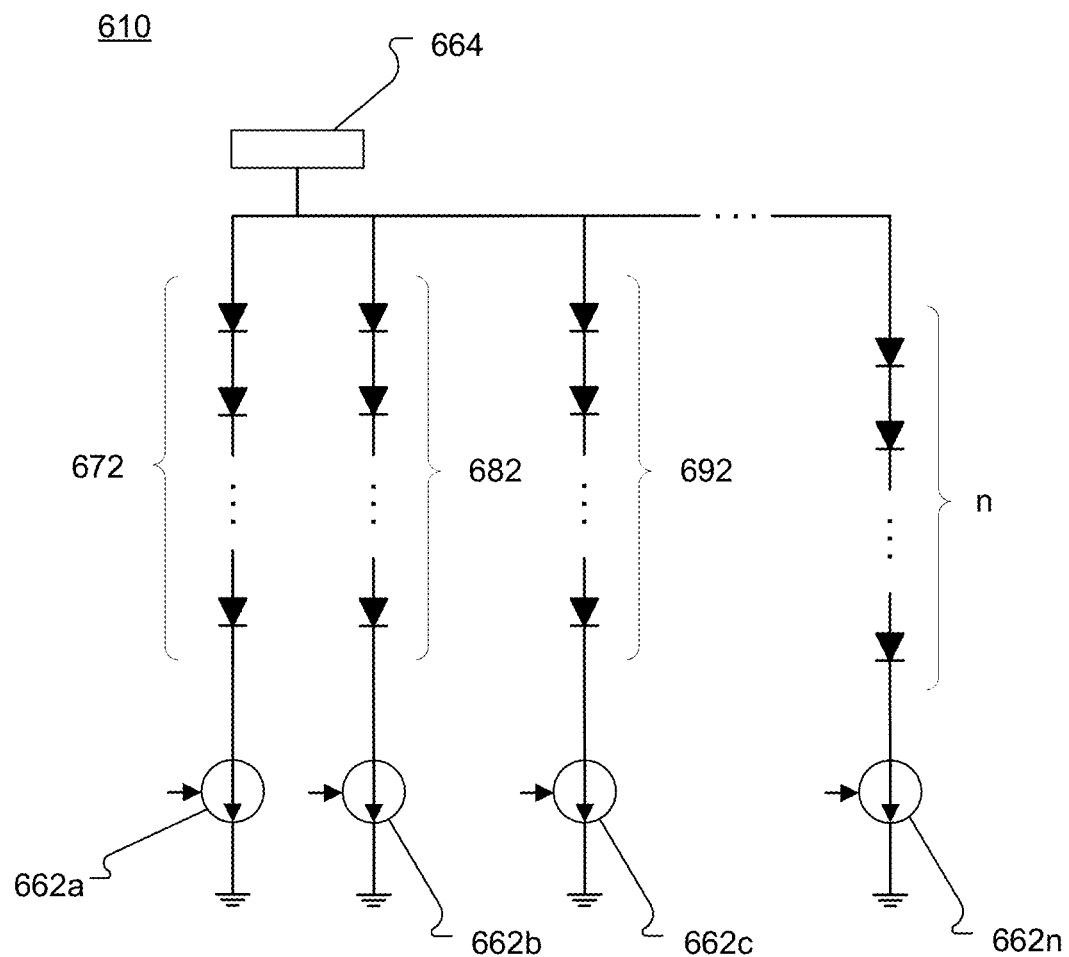

FIGS. 6A and 6B are examples of control circuitry for an illumination device, such as illumination devices 400 and 500. The control circuitry 600 shown in FIG. 6A controls every light-emitting element independently of each other to allow independent control of the brightness of each light-emitting element. As shown in FIG. 6A, light-emitting element 670 can be controlled by a current source 662a, light-emitting element 680 can be controlled by a current source 662b, light-emitting element 690 can be controlled by a current source 662c. Generally, n light-emitting elements (e.g., 670, 680, 690, . . . , n) can be controlled independently by n current sources (e.g., 662a, 662b, 662c, . . . , 662n). The light-emitting elements can be connected in parallel to a voltage source, such as voltage source 664, to provide, in conjunction with the corresponding current sources, power to the groups of light-emitting elements.

The control circuitry 610 shown in FIG. 6B controls several groups of light-emitting elements independently of each other. Generally, the light-emitting elements of an illumination device, such as illumination devices 400 and 500, can be split into groups that are controlled independently of each other to allow independent control of the brightness of each group of light-emitting elements. In some implementations, the split can be arranged by correlated color temperature (CCT), chromaticity, or otherwise. As shown in FIG. 6B, the group of light-emitting elements 672 can be controlled by a current source 662a, the group of light-emitting elements 682 can be controlled by a current source 662b, and light-emitting elements 692 can be controlled by a current source 662c. The light-emitting elements can be split into n groups (e.g., 672, 682, 692, . . . , n) that are controlled independently by n current sources (e.g., 662a, 662b, 662c, . . . , 662n). The groups of light-emitting elements are connected in parallel to a voltage source, such as voltage source 664, to provide, in conjunction with the corresponding current sources, power to the groups of light-emitting elements.

In some implementations, the illumination device can include a sensor that measures color coordinates of the light emitted by the light-emitting elements. In some implementations, the sensor can be configured to indicate estimates of light intensity, spectral distribution, or both. The sensor can be coupled with a control loop that can be configured to dim the color or brightness of individual light sources, for example, when a portion of a phosphor layer degrades less over time than other portions of the phosphor layer, or some phosphor layers degrade less over time than other phosphor layers. Such control mechanisms can maintain constant illumination pattern or color distribution of the illumination device over its lifetime. For example, when portions of a phosphor layer degrade over time, blue light may become more visible. The shift to blue light can be compensated by adjusting the output (e.g., dimming) of the light sources respective to their emission spectrum.

Illumination devices, such as illumination device 400 and 500 can be controlled in a feed forward, a feedback or a mixed feed forward and feedback manner. In a feed forward control scheme, drive currents and/or drive voltages of different light-emitting elements, or different groups of light-emitting elements, may be determined based on one or more of these drive currents and/or drive voltages alone or in other ways, for example.

Figure 7:
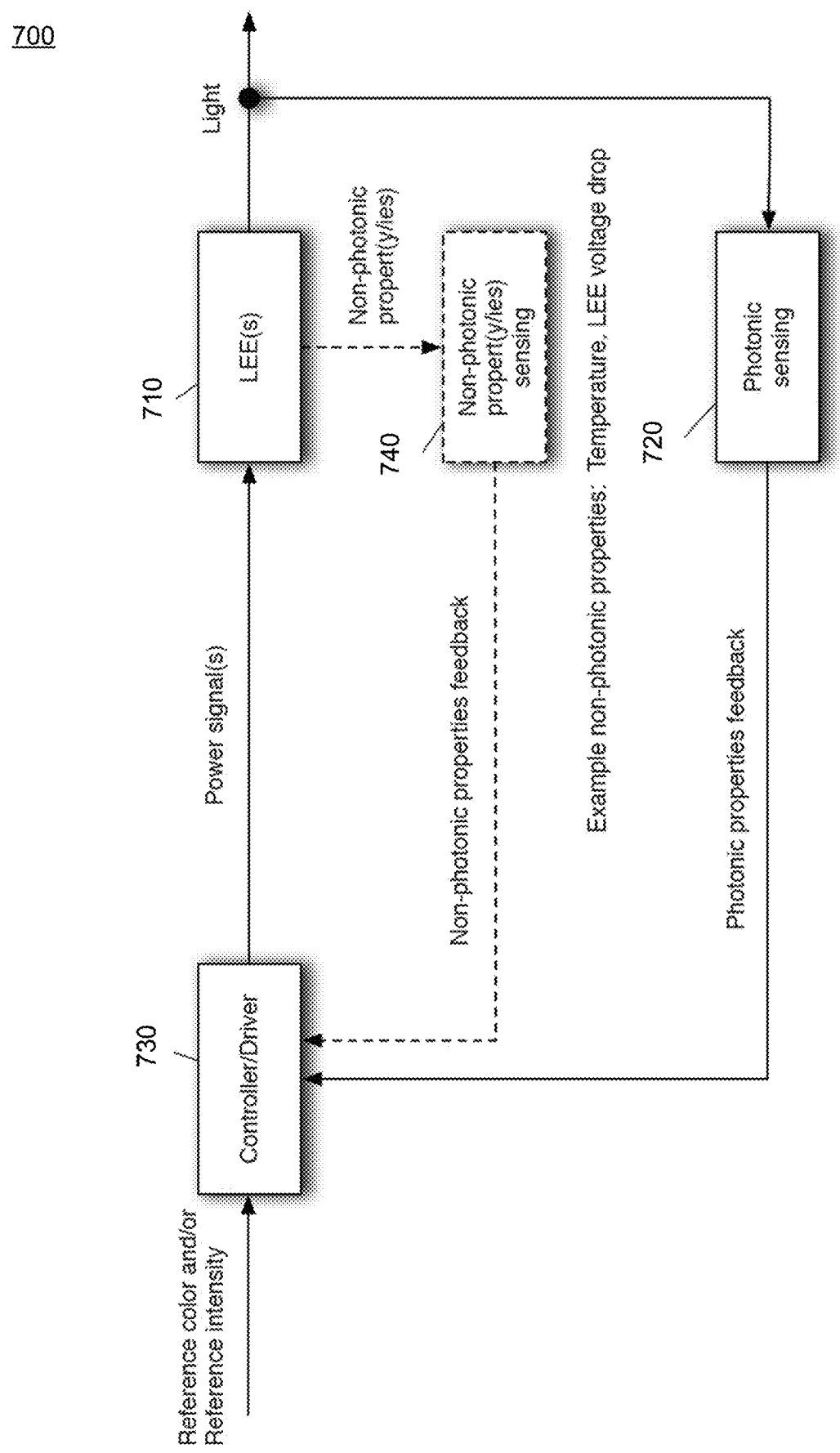
FIG. 7 is a schematic diagram showing an example feedback circuit used to provide intra-system source feedback for an illumination device.

FIG. 7 is a schematic diagram showing an example feedback circuit 700 used to provide intra-system source feedback for an illumination device, such as the illumination devices 400 and 500. The feedback circuit 700 can be used to control one or more light-emitting elements, or one or more groups of light-emitting elements, (e.g., by adjusting the brightness) of the illumination device. In this example, the feedback circuit 700 includes a photonic sensing unit 720 and a controller unit 730.

The photonic sensing unit 720 can be placed to sample mixed light, for example downstream from a light-mixing element (e.g., a scattering element or light guide) of the illumination device, to sense mixed light that is output by the light-mixing element of the illumination device. In some implementations, the photonic sensing unit 720 can include a color detector, an intensity detector, or a combination of both. In some implementations, one or more of the detectors can be arranged such that mostly mixed light that is Fresnel-reflected at an exit interface of an extractor element is being sensed. Moreover, the one or more detectors can be arranged such that the mixed light reflected by the exit surface of the extractor element and received by the sensor originates from a large portion of an optical interface between the light-mixing element and the extractor element.

The controller unit 730 can be implemented as hardware, software or a combination of both. For example, the controller unit 730 can be implemented as a software driver executed by a specialized or general purpose chip. The controller unit 730 parses sensing signals received from the photonic sensing unit 720. Parsed signal values are compared by the controller unit 730 to reference color values or reference intensity values, referred to as reference values. The controller unit 730 accesses such reference values in one or more lookup tables, for instance. For example, the controller unit 730 selectively transmits adjustment signals to a power driver to adjust relative power values for a combination of different color light-emitting elements 710, in response to sensing that chromaticity of the mixed light has changed. As another example, the controller unit 730 selectively transmits adjustment signals to the power driver to adjust power values for one or more light-emitting element(s) 710, in response to sensing that the intensity of the scattered light propagating in the extractor element has changed.

In some implementations, the feedback circuit 700 can include a non-photonic propert(y/ies) sensing unit 740. Examples of non-photonic properties sensed by this unit are temperature, voltage drop, etc. In such implementations, the controller unit 730 parses the non-photonic sensing signals received from the non-photonic propert(y/ies) sensing unit 740 in combination with the photonic sensing signals received from the photonic sensing unit 720. Values of the parsed combination of photonic and non-photonic sensing signals are used by the controller unit 730 to transmit adjustment signals to the driver that drives the LEEs 710.

The invention claimed is:

1. An illumination device, comprising:
a first light source configured to emit first pump light having a first spectral power distribution;
a second light source configured to emit second pump light having a second spectral power distribution different from the first spectral power distribution;
a first inelastic scattering element arranged to receive the first pump light and configured to emit first provided light upon receipt of the first pump light, in combination the first light source and the first inelastic scattering element being configured to emit light having a third spectral power distribution broader than the first spectral power distribution; and
a second inelastic scattering element arranged to receive the second pump light and configured to emit second provided light upon receipt of the second pump light, in combination the second light source and the second inelastic element being configured to emit light having a fourth spectral power distribution broader than the second spectral power distribution,
wherein the third and fourth spectral power distributions are different.

2. The illumination device of claim 1, wherein the third spectral power distribution is Stokes shifted compared to the first spectral power distribution.

3. The illumination device of claim 1, wherein the fourth spectral power distribution is Stokes shifted compared to the second spectral power distribution.

4. The illumination device of claim 1, wherein the first and second inelastic scattering elements comprise a quantum dot phosphor material.

5. The illumination device of claim 1, wherein the first and second inelastic scattering elements have a dome shape.

6. The illumination device of claim 1, wherein each inelastic scattering element is spaced apart from its corresponding light source and has an inner surface facing the light source.

7. The illumination device of claim 6, wherein each of the first and second inelastic scattering elements encapsulates a medium adjacent to the inner surface of the inelastic scattering element that has a refractive index that is smaller than a refractive index of the inelastic scattering element.

8. The illumination device of claim 7, wherein the medium is air.

9. The illumination device of claim 7, wherein the medium is a silicone.

10. The illumination device of claim 1, comprises
a substrate having a first surface,
wherein the first and second light sources are disposed on the first surface.

11. The illumination device of claim 10, wherein at least a portion of the first surface is a diffusely reflecting surface.

12. The illumination device of claim 10, wherein at least a portion of the first surface is a specularly reflecting surface.

13. The illumination device of claim 10, further comprising electrical connections for connecting the first and second light sources to a power source, the electrical connections being arranged such that power to each of the first and second light sources is separately adjustable.

14. The illumination device of claim 10, further comprising
an elastic scattering element surrounding, at least in part, the first and second inelastic scattering elements,
wherein the elastic scattering element elastically scatters the first and second provided light emitted by the first and second inelastic scattering elements to output light to an ambient environment.

15. The illumination device of claim 14, wherein the elastic scattering element is spaced apart from the first and second inelastic elements and coupled to the substrate to form an enclosure, the elastic scattering element having an input surface facing the first and second inelastic elements and an output surface opposing the input surface.

16. The illumination device of claim 15, wherein an index of refraction of the elastic scattering element is larger than an index of refraction of a medium in the enclosure and larger than an index of refraction of the ambient environment.

17. The illumination device of claim 16, further comprising
an extractor element coupled to the output surface of the elastic scattering element.

18. The illumination device of claim 17, wherein the index of refraction of the elastic scattering element is smaller than an index of refraction of the extractor element.

19. The illumination device of claim 17, wherein the extractor element has a transparent exit surface opposing the output surface of the elastic scattering element that is shaped such that an angle of incidence on the exit surface of the light provided by the elastic scattering element that directly impinges on the exit surface is less than a critical angle for total internal reflection at the exit surface.

20. The illumination device of claim 17, wherein the elastic scattering element is a coating applied to a surface of the extractor element.

21. The illumination device of claim 17, wherein the elastic scattering element is a roughened surface of the extractor element.

22. The illumination device of claim 1, wherein the first and second inelastic scattering elements are spaced apart from each other.

* * * * *